United States Patent [19]
Aspacio et al.

[11] Patent Number: 6,134,252
[45] Date of Patent: Oct. 17, 2000

[54] ENHANCED GLITCH REMOVAL CIRCUIT

[75] Inventors: Reuben A. Aspacio, Fremont; Rajesh Bharadwaj, San Jose; Hieu Xuan Nguyen, Fremont, all of Calif.

[73] Assignee: Advanced Micro Devices, Inc., Sunnyvale, Calif.

[21] Appl. No.: 08/826,858

[22] Filed: Apr. 11, 1997

[51] Int. Cl.[7] .................................................. G01R 29/02
[52] U.S. Cl. ............................................. 372/34; 326/26
[58] Field of Search .................................. 326/93, 29, 26; 327/34, 94, 391

[56] References Cited

U.S. PATENT DOCUMENTS

| | | |
|---|---|---|
| 5,151,615 | 9/1992 | Egawa . |
| 5,194,768 | 3/1993 | Lozano . |
| 5,723,993 | 3/1998 | Cha .......................................... 327/34 |
| 5,959,465 | 9/1999 | Beat .......................................... 326/39 |

FOREIGN PATENT DOCUMENTS

| | | |
|---|---|---|
| 0 320 711 A2 | 6/1989 | European Pat. Off. . |
| 0 458 766 A1 | 11/1991 | European Pat. Off. . |
| 0458766A1 | 11/1991 | European Pat. Off. ......... H03K 5/01 |
| 4443954 A1 | 6/1995 | Germany . |

*Primary Examiner*—Michael Tokar
*Assistant Examiner*—Anh Tran

[57] ABSTRACT

An enhanced glitch eater circuit for eliminating glitch signals occurring within a predetermined period from a raising edge or a falling edge of a signal pulse is comprised of an inverter connected to a transmission gate which is controlled by a two-input XNOR (exclusive-NOR) gate receiving a latched signal at one input and a delay latched signal at the other input, the latched signal being from the output of the transmission gate. The latched signal may be reset by a transistor.

7 Claims, 3 Drawing Sheets

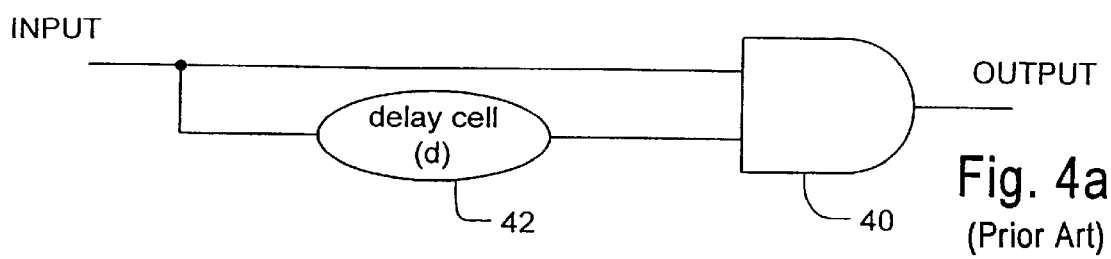
Fig. 4a
(Prior Art)
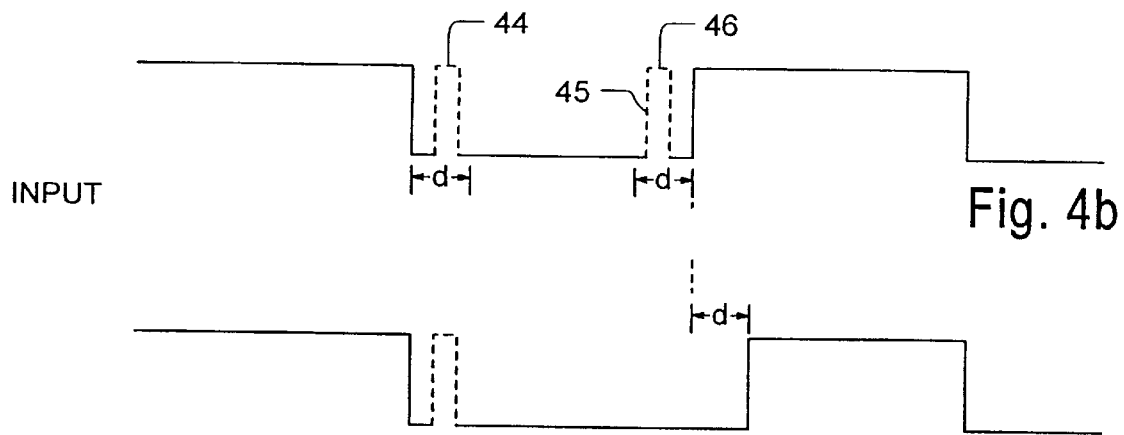
Fig. 4b
Fig. 4c

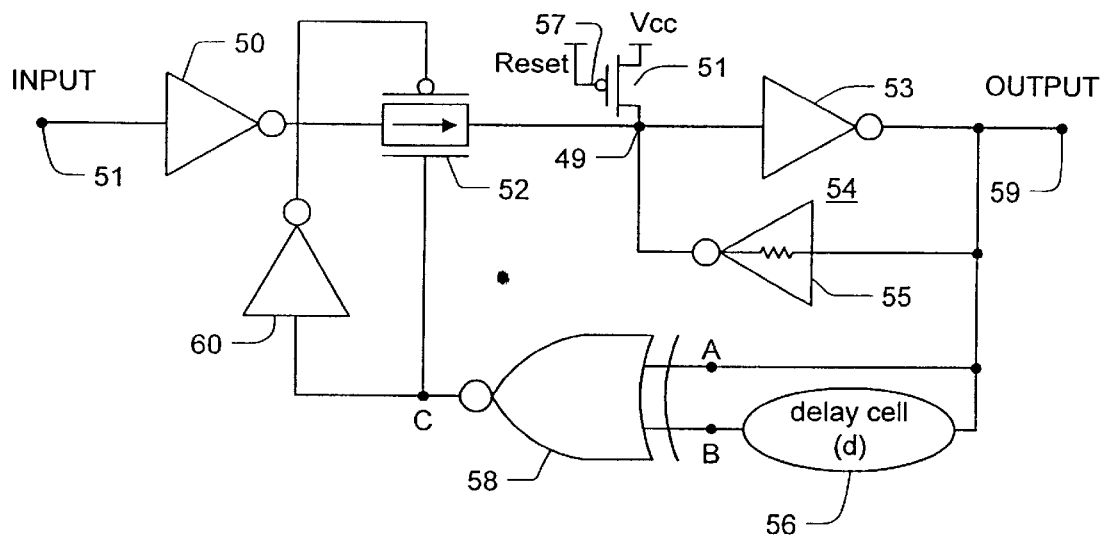
Fig. 5
Fig. 6a
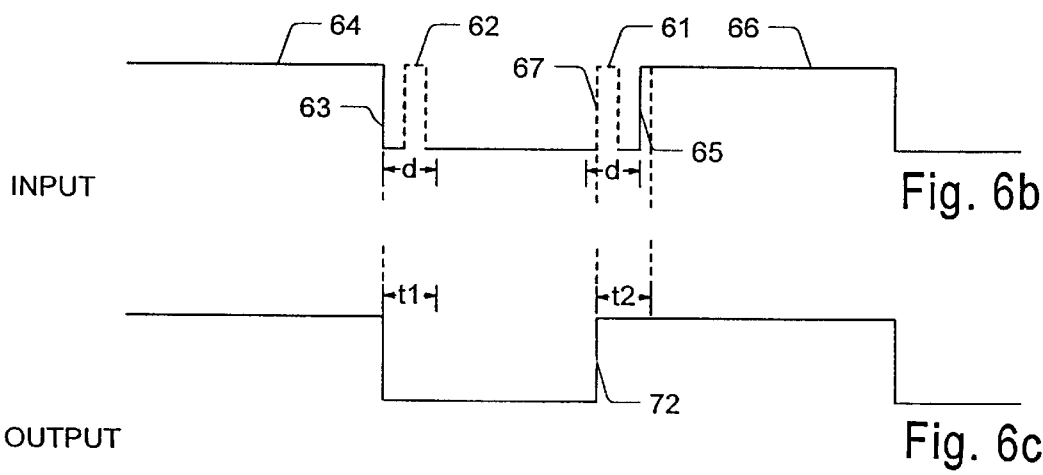
Fig. 6b
Fig. 6c

ENHANCED GLITCH REMOVAL CIRCUIT

BACKGROUND OF THE INVENTION

1. Field of the Invention

The present invention generally relates to signal improvement circuits, and in particular, relates to circuits for removal of glitch signals from periodic waveforms such as clock signals.

2. Description of the Prior Art

Electrical circuits, including circuits packaged in integrated circuits (ICs), often have to operate in noisy and hostile environments where spurious pulses (also referred to as glitch signals) may be generated in the process. Glitch signals if untreated may affect the operation of the circuit and hamper the performance of the entire system. Thus, circuits must be designed to anticipate and handle the spurious pulses or glitch signals in order to maintain consistency and reliability of circuit operation.

Signals that are affected by a noisy environment where glitch signals are generated includes clock signals and handshake signals, which drive the various circuitry within a system. Referring to FIG. 1, a clock signal is depicted in the form of a repetitive sequence of pulses where high voltage levels followed by low voltage levels. The high voltage levels digitally represent "1"s and the low voltage levels digitally represent "0"s.

The clock signal may become noisy and deviate from its original rectangular shape by the time it reaches its destination terminal. FIG. 2 illustrates a clock signal having several possible glitch signals therein. A glitch signal following the falling edge 10 of a clock pulse is indicated at 12, where the signal occurs within a time period "d" from the falling edge 10. Another glitch signal closer in time preceding the rising edge 14 of a second clock pulse is indicated at 16. A glitch signal may also occur within a high clock pulse causing a temporarily drop of the pulse from a high voltage level to a low voltage level, such as the glitch signals indicated at 18 and 20. Note that glitch signals may be of any shape and duration (though typically are transient).

These glitch signals can be easily categorized into two types. The first type occurs while the clock signal is in the low voltage state and is as illustrated by glitch signals at 12 and 16. The second type occurs while the clock signal is in the high state and is as illustrated by glitch signals at 18 and 20.

Ideally, circuits encountering these types of glitch signals should eliminate them and restore the signal to its original shape. The disclosure herein focuses on circuits for eliminating glitch signals of the first type.

Prior art circuits for eliminating glitch signals of the first type remove a glitch signal occurring either preceding the rising edge of a pulse or occurring following the falling edge of a clock pulse but not near both edges. Referring to FIG. 3a, a prior art glitch-eater circuit for eliminating glitch signals occurring following the falling edge of a clock pulse is illustrated. The circuit comprises an OR gate 30 and a delay cell 32. The input signal is routed to one input of the OR gate 30 and to the input of the delay cell 32; the output of the delay cell 32 is routed to the other input of the OR gate 30. Referring to FIG. 3b, a clock signal, having a glitch signal following near the falling edge of a clock pulse and a glitch signal preceding the rising edge of another clock pulse as illustrated at 34 and 36 respectively, is processed through the delay cell (FIG. 3a, 32) and the OR gate (FIG. 3a, 30). In this circuit, for a time period "d" after any pulse has gone from a high voltage level to a low voltage level, the output of the delay cell remains high and consequently causes the OR gate to produce a high signal for a time duration "d" after any falling edge has occurred. Thus, upon encountering a glitch signal occurring within a period "d" from the falling edge of a clock signal, the circuit will cause the clock signal to remain high for an additional time period "d" as illustrated in FIG. 3c, after the occurrence of the falling edge of the glitch signal (FIG. 3b, 38) (not the falling edge of the clock signal). Note that the second glitch signal 36 preceding the rising edge of the next clock pulse is not eliminated at all.

In another prior art circuit illustrated in FIG. 4a, a glitch-eater circuit for eliminating a glitch signal preceding the rising edge of a clock pulse is illustrated. Here, the circuit comprises a two-input AND gate 40 and a delay cell 42. The input signal is passed to one leg of the AND gate 40 and to the input of the delay cell 42. The output of the delay cell is passed to the second leg of the AND gate 40. Referring to FIG. 4b, an input signal contains a first glitch signal 44 following the falling edge of a first clock pulse and a glitch signal 46 preceding the rising edge of a second clock pulse. This circuit will not handle glitch signals occurring within a time period "d" from the falling edge of the clock pulse. However, upon the occurrence of the rising edge 45 of a pulse 46, the delay cell (FIG. 4a, 42) is still producing a low signal to the AND gate thereby causing the AND gate output signal to be low. In effect, this circuit delays a rising edge (and therefore a pulse) by a time period "d" and eliminates a glitch signal in the process. FIG. 4c illustrates the output of this circuit.

The two above prior art circuits were designed to handle glitch signals occurring near either the rising edges or the falling edges of signal pulses, but not both. It would be desirable to have a single circuit that can handle glitch signals occurring near both edges. Although, conceivably, the two circuits may be combined in some manner to achieve the same effect, the disadvantage with such approach is that there would be redundant and unnecessary circuitry.

SUMMARY OF THE INVENTION

Therefore, an objective of the present invention is to provide a circuit for eliminating glitch signals occurring near both the falling edge and rising edge of a signal pulse.

It is another object of the present invention to provide a simple yet reliable circuit for the removal of glitch signals in a periodic pulse.

Briefly, an enhanced glitch-eater circuit in accordance with a presently preferred embodiment of the present invention comprises an inverter connected between a circuit input terminal and a transmission gate which is controlled by a two-input XNOR (exclusive-NOR) gate and outputs to a latch coupled to a circuit output terminal. The XNOR gate receives the latched output signal at one of its inputs and a delayed latched signal at its other input, the delayed latched signal being generated by a delay cell receiving its input from the latch. The signal stored in the latch may be reset by the use of a simple transistor connected to a voltage source.

An advantage of the present invention is that it provides a circuit for eliminating glitch signals occurring near both the falling edges and rising edges of clock pulses.

Another advantage of the present invention is that it provides a simple yet reliable circuit for the removal of glitch signals in a periodic pulse train.

These and other features and advantages of the present invention will be understood upon examining the figures and reading the following detailed description of preferred embodiment of the invention.

IN THE DRAWINGS

FIG. 4a shows a prior art glitch-eater circuit for eliminating glitch signals occurring within a time period "d" preceding the rising edge of a pulse;

FIG. 4b illustrates a clock signal having several glitch signals therein as input to the circuit of FIG. 4a;

FIG. 4c illustrates the output signal generated by the circuit of FIG. 4a in response to the input signal of FIG. 4b;

FIG. 5 illustrates a presently preferred embodiment of the present invention;

FIG. 6a shows a reset signal for resetting the circuit of FIG. 5 prior to operation thereof;

FIG. 6b illustrates a clock signal having several glitch signals therein as input to the circuit of FIG. 5;

FIG. 6c illustrates the output signal generated by the circuit of FIG. 5 in response to the input signal of FIG. 6b.

DETAILED DESCRIPTION OF THE PREFERRED EMBODIMENTS

Figure 1:
FIG. 1 illustrates a clock signal having pulses defined by the periodic rise and fall of voltage levels.
Figure 2:
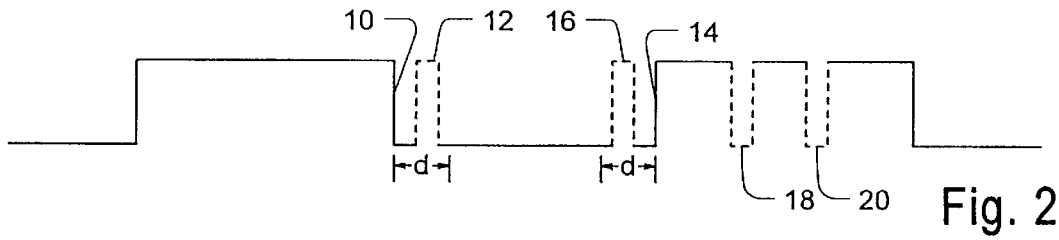
FIG. 2 illustrates possible glitch signals affecting the clock signal of FIG. 1 in a noisy environment.
Figure 3A:
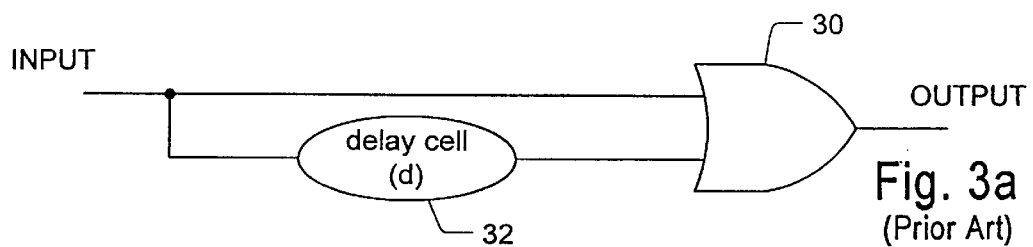
FIG. 3a illustrates a prior art glitch-eater circuit for eliminating glitch signals occurring within a time period "d" following the falling edge of a pulse.
Figure 3B:
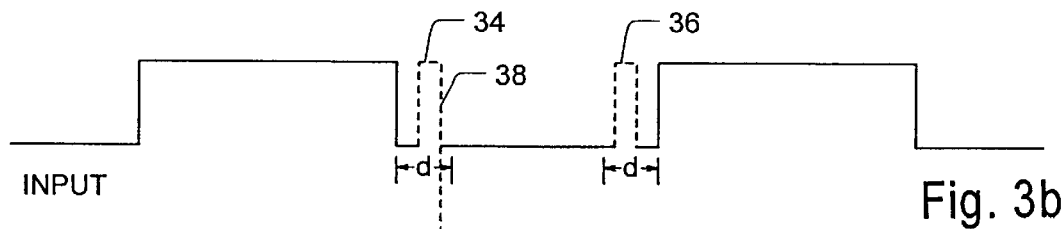
FIG. 3b illustrates a clock signal having glitch signals therein as input to the circuit of FIG. 3b.
Figure 3C:
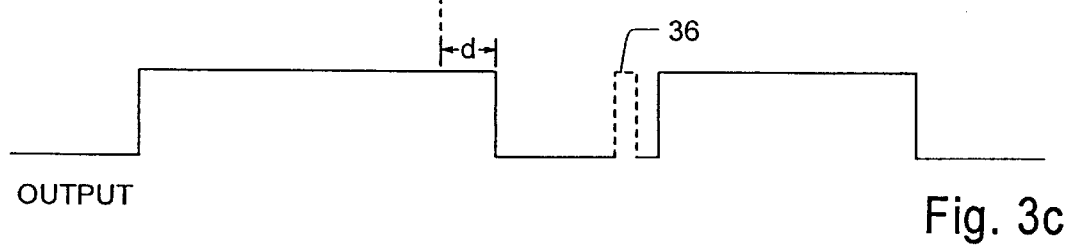
FIG. 3c illustrates the output signal generated by the circuit of FIG. 3a in response to the input signal of FIG. 3b.

Referring to FIG. 5, a presently preferred embodiment of an enhanced glitch eater circuit is depicted and includes inverters 50 and 60, a transmission gate 52, a latch 54, a delay cell 56, a XNOR gate 58, and a transistor 51. The input terminal 51 is connected to the input an inverter 50 where the output of which is connected to a transmission gate 52. When the transmission gate is closed, the inverted input signal is latched by latch 54 which is comprised of inverters 53 and 55. The output of the latch is connected to an output terminal 55, an input of a two input XNOR gate 58, and a delay cell 56. The output of the delay cell 56 is connected to the second input of the XNOR gate 58. The output of the XNOR gate 58 operates the transmission gate 52 by direct application of its output to one side of transmission gate 52 and by indirect application of its output via inverter 60 to the other side of transmission gate 52. The signal stored in the latch can be reset prior to operation of the circuit by input of a reset signal at the gate terminal 57 of transistor (PMOS) 51. Note that the truth table for the XNOR gate is as follows:

| Input A | Input B | Output |
|---------|---------|--------|
| 0 | 0 | 1 |
| 0 | 1 | 0 |
| 1 | 0 | 0 |
| 1 | 1 | 1 |

In operation, the circuit is first reset by dropping the voltage level at the gate terminal 57 of the transistor 51 for a period of time sufficient to charge the latch 54. When the latch is charged, it generates a low signal at the output terminal 59 and causes XNOR gate 58 to generate a high signal at node C to close the transmission gate 52. An input signal applied at 51 is inverted and allowed to pass through the transmission gate 52 and is temporarily stored in latch 54. The output of the latch is fed to the output terminal and is fed to XNOR gate 58 both directly and via delay cell 56. The output of the XNOR gate controls the operation of the transmission gate 52.

When the input signal goes from high to low, referring to FIG. 6b, and when a glitch signal 62 occurs within a time period "d" following the falling edge 63 of a pulse 64, the following tables illustrate the chronological changes in the states of the signals at various points in the circuit and during various time periods, noting that points "A", "B", and "C" are circuit points illustrated in FIG. 5:

After the reset signal:

TABLE 1a

| Input | Output | A | B | C | Transmission gate |
|-------|--------|---|---|---|-------------------|
| don't care | don't care | 0 | 0 | 1 | closed |

Before the occurrence of the falling edge (63):

TABLE 1b

| Input | Output | A | B | C | Transmission gate |
|-------|--------|---|---|---|-------------------|
| 1 | 1 | 1 | 1 | 1 | closed |

Within a time period "t1" following the falling edge (63):

TABLE 1c

| Input | Output | A | B | C | Transmission gate |
|-------|--------|---|---|---|-------------------|
| 0 | 0 | 0 | 1 | 0 | open |

After a time period "t1" following the falling edge (63):

TABLE 1d

| Input | Output | A | B | C | Transmission gate |
|-------|--------|---|---|---|-------------------|
| 0 | 0 | 0 | 0 | 1 | closed |

Table 1c shows that the transmission gate is open within a time period "d" following falling edge 63 of pulse 64. Thus, a glitch signal occurring within time period "d" following a falling edge is not reproduced at the output terminal 59 and is thus eliminated.

Likewise, the following tables illustrate the chronological changes of the signals within the circuit in eliminating a glitch signal occurring during a time period "d" prior to a rising edge 65 of a signal pulse 66:

Before glitch signal 61 (at 67):

TABLE 2a

| Input | Output | A | B | C | Transmission gate |
|-------|--------|---|---|---|-------------------|
| 0 | 0 | 0 | 0 | 1 | closed |

During a time period "t2" following the raising edge of a glitch signal:

TABLE 2b

| Input | Output | A | B | C | Transmission gate |
|-------|--------|---|---|---|-------------------|
| 1     | 1      | 1 | 0 | 0 | open              |

After a time period "t2":

TABLE 2c

| Input | Output | A | B | C | Transmission gate |
|-------|--------|---|---|---|-------------------|
| 1     | 1      | 1 | 1 | 1 | closed            |

As is illustrated by Table 2b, transmission gate 52 remains open for a period "t2" after encountering a rising edge, and glitch signal 61 is incorporated within the high clock pulse and thus eliminated. As it should be noted, time periods t2 and t2 are of duration "d" and the selection for time period "d" should be carefully chosen so that the advancement of the high clock pulse does not affect performance and operation of the overall system. The illustrated delay cell 56 is a fixed time delay cell, the preferred embodiment can be adapted to use a programmable delay cell.

Referring to FIG. 6a, a reset signal 70 is illustrated which turns on transistor (FIG. 5, 51) and pulls the voltage at the latch (FIG. 5, 54) through the transistor (FIG. 5, 51) to Vcc, causing the latch to generate a low signal at the output terminal (FIG. 5, 59). FIG. 6b illustrates an input signal having two glitch signals, one occurring near the falling edge 63 of pulse 64 and one occurring near the rising edge 65 of the clock pulse 66. By passing the input signal of FIG. 6b through the circuit illustrated in FIG. 5, the output signal illustrated in FIG. 6c is generated, where both glitch signals are eliminated.

Although the present invention has been described in terms of a specific embodiment it is anticipated that alterations and modifications thereof will no doubt become apparent to those skilled in the art. It is therefore intended that the following claims be interpreted as covering all such alterations and modifications as fall within the true spirit and scope of the invention.

What I claim is:

1. A circuit for eliminating glitch signals in an input signal, comprising:

an input terminal for receiving an input signal;

an inverter connected in series to said input terminal, said inverter receiving said input signal and generating an inverted signal;

a transmission gate connected in series to said inverter and receiving said inverted input signal, said transmission gate in response to a control signal controlling passage of said inverted input signal to an output point of said transmission gate;

a storage unit connected to the output point of said transmission gate for storing said inverted input signal and generating a stored signal at an output terminal, said storage unit including two inverters connected to form a latch;

a logic unit connected to said output terminal for receiving said stored signal and generating said control signal in response to said stored signal to operate said transmission gate, said logic unit includes a two-input exclusive-NOR gate and a delay unit, said delay unit receiving said stored signal, generating a delayed signal therefrom, and passing said delayed signal to one input of said exclusive-NOR gate, said exclusive-NOR gate receiving said stored signal as a second input and generating said control signal in response to said stored signal and said delayed signal; and a transistor connected to said latch for charging said latch to a predetermined value in response to a reset signal.

2. A circuit for eliminating glitch signals in an input signal, comprising:

an input terminal for receiving an input signal;

a transmission gate connected to said input terminal and receiving said input signal, said transmission gate in response to a control signal controlling passage of said input signal to an output point of said transmission gate;

a storage unit connected to the output point of said transmission gate for storing said input signal and generating a stored signal at an output terminal;

a logic unit connected to said output terminal for receiving said stored signal and generating said control signal in response to said stored signal to operate said transmission gate, said logic unit includes a two-input exclusive-NOR gate and a delay unit, said delay unit receiving said stored signal, generating a delay signal therefrom, and passing said delay signal to one input of said exclusive-NOR gate, said exclusive-NOR gate receiving said stored signal as a second input and generating said control signal in response to said stored signal and said delay signal; and a transistor connected to said latch for charging said latch to a predetermined value in response to a reset signal.

3. A circuit as recited in claim 1 wherein said logic unit generates said control signal as a function of a predetermined time delay.

4. A circuit as recited in claim 1 wherein said input signal is a periodic signal.

5. A circuit for eliminating glitch signals, comprising:

a first inverter for receiving an input signal and generating an inverted input signal, said input signal having one or more glitch signals therein;

a transmission gate receiving said inverted input signal and controlling the passage of said inverted input signal to an output point of said transmission gate in response to a control signal;

a storage unit connected to the output point of said transmission gate for receiving and storing said inverted input signal, said latch generating a stored signal to an output terminal;

a delay cell receiving said stored signal and generating a delayed signal;

an exclusive-NOR gate having a first input terminal connected to said delay cell for receiving said delayed signal, a second input terminal connected to said latch for receiving said stored signal, said exclusive-NOR gate generating said control signal to control the operation of said transmission gate; and a transistor connected to said latch for charging said latch to a predetermined value in response to a reset signal.

6. A circuit as recited in claim 5 wherein said input signal is a periodic signal.

7. A circuit as recited in claim 5 wherein said storage unit includes two inverters connected to form a latch.

* * * * *